United States Patent [19]

Bauer et al.

[11] 3,751,259

[45] Aug. 7, 1973

[54] PHOTOPOLYMERIZABLE COPYING COMPOSITION

[75] Inventors: Sigrid Bauer, Hahn/Tanus; Kurt-Walter Klupfel, Wiesbaden-Sonnenberg; Raimund Josef Faust, Wiesbaden-Biebrich, all of Germany

[73] Assignee: Kalle Aktiengesellschaft, Wiesbaden-Biebrich, Germany

[22] Filed: June 2, 1971

[21] Appl. No.: 149,396

[30] Foreign Application Priority Data

June 4, 1970 Germany .................. P 20 27 467.3

[52] U.S. Cl. .................... 96/115 P, 96/33, 96/35.1, 204/159.15, 204/159.23

[51] Int. Cl. .............................................. G03c 1/70

[58] Field of Search ...................... 96/115 R, 115 P, 96/35.1; 204/159.15, 159.23

[56] References Cited

UNITED STATES PATENTS

| | | | |
|---|---|---|---|
| 3,515,552 | 6/1970 | Smith | 96/115 P |
| 2,969,731 | 1/1961 | Kendall | 96/115 R |
| 2,980,535 | 4/1961 | Schroeter | 96/35.1 |

*Primary Examiner*—Ronald H. Smith
*Attorney*—James E. Bryan

[57] ABSTRACT

This invention relates to a photopolymerizable copying composition comprising at least one binder, at least one polymerizable compound and at least one photoinitiator having one of the formulae:

I

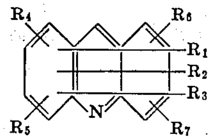

and

II

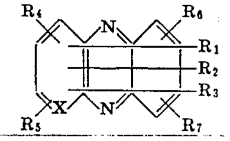

in which $R_1$, $R_2$, and $R_3$ are selected from the group consisting of hydrogen, halogen, alkyl, alkoxy, aryl, aryloxy, amino, acylamino, and aralkenyl groups, $R_4$, $R_5$, $R_6$ and $R_7$ are H or annelated benzene rings, with no more than two annelated benzene rings being present per molecule, however, and X is selected from the group consisting of N and $\overset{H}{\underset{|}{C}}$.

5 Claims, No Drawings

PHOTOPOLYMERIZABLE COPYING COMPOSITION

The present invention relates to a novel photopolymerizable copying composition which is used either in liquid form or in the form of a solid layer on a support, and which contains, as essential components, at least one binder, at least one polymerizable compound, and at least one photoinitiator.

Known photoinitiators suitable for the photopolymerization of unsaturated compounds are, for example, hydrazones, five-membered nitrogen-containing heterocyclic compounds, mercapto compounds, pyrylium or thiopyrylium salts, polynuclear quinones, synergistic mixtures of different ketones, and dyestuff/redox systems.

Most of these compounds have the disadvantage that they can be used only for particular light-sensitive layers. In most cases, their relatively low activity is just sufficient for the photo-crosslinking of high molecular weight unsaturated binders, such as polyvinyl cinnamate or the acrylated epoxy resins described in U.S. Pat. No. 3,427,161, but is normally unsuited for the photopolymerization of low molecular weight vinyl compounds.

Other photoinitiators, for example those mentioned in Dutch Patent application No. 67 15856, require the addition of appropriate dyestuff sensitizers to increase their light-sensitivity. The same applies to the hydrazones disclosed in published German Patent Application (DOS) No. 1,495,973, which, moreover, are not stable and, therefore, unsuited for the preparation of storable layers.

Still other initiators, for example the polynuclear quinones, produce only a relatively low degree of cross-linking during photopolymerization, so that a differentiation between the image areas and non-image areas can be achieved only when using relatively large quantities of the initiator.

The dye/redox system described in U.S. Pat. No. 3,097,096 can be used only for solutions or when using water-soluble colloids as binders. The cross-linked areas produced by exposure are unsuitable for the preparation of high-quality printing forms, however, because their cross-linking density is not sufficient and their surfaces are too hydrophilic.

Now a new group of active photoinitiators has been found whose initiating activity in the spectral range between 300 and 450 $\mu$, especially in the presence of oxygen, exceeds that of known initiators.

Further, the photoinitiators used according to the invention have the advantage that they retard the heat-catalyzed addition polymerization of acrylic compounds, so that storable or stable production layers result.

According to the present invention, a photopolymerizable copying composition is provided which contains at least one binder, at least one polymerizable compound, and at least one photoinitiator, the latter being a compound of the acridine or phenazine type which may contain a further nitrogen atom as a hetero atom in one of its external aromatic rings A and C, and up to two annelated benzene rings attached to the rings A and C, and which, attached to the rings A, B, and C, carries three substituents, which may be identical or different and which are H, halogen, alkyl, alkoxy, aryl, aryloxy, amino, acylamino, or aralkenyl groups.

For commercial purposes, the copying composition according to the invention may be used in the form of a solution or dispersion, for example as a so-called photo-resist composition, which is applied by the consumer to an individual support — e.g. for etching shaped articles or for producing printed circuits, stencils, plates, screen printing stencils, and the like — and then dried, exposed, and developed to form a layer with imagewise differentiation.

With particular advantage, the copying composition according to the invention may be marketed in the form of a solid photopolymerizable layer on a support, i.e. as a light-sensitive reproduction material from which printing forms, relief images, etch resists, stencils, masks, screen printing stencils, color proofing foils, individual copies, and the like may be produced. An important application is, above all, the manufacture of storable, presensitized printing plates for planographic, relief, and gravure printing.

The compounds to be used according to the invention as photoinitiators are known per se; they are described, for example, in "The Ring Index", 2nd Edition, published by the American Chemical Society, Washington, D. C., USA. The RRI number (RRI = revised ring index) attributed to each condensed heterocyclic system in this publication is mentioned for easier identification in the list of compounds given in Table 1. The ring structure of the compounds used in the examples can be seen from the following formulae:

Formula 1

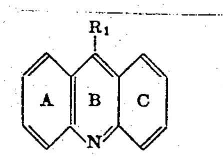

Formula 2

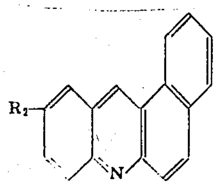

Formula 3

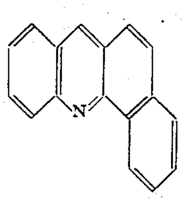

Formula 4

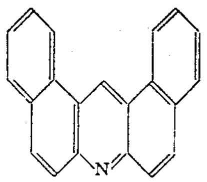

Formula 5

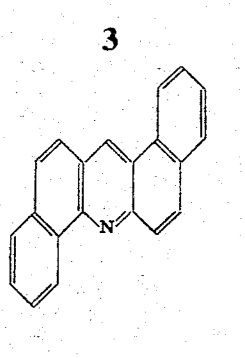

Formula 6

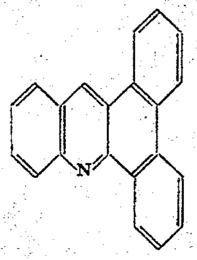

Formula 7

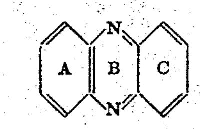

Formula 8

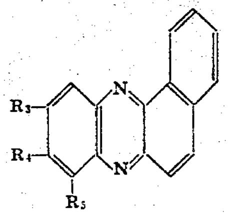

Formula 9

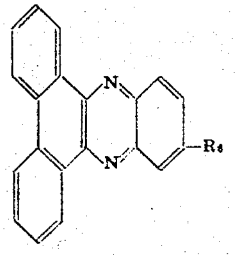

Formula 10

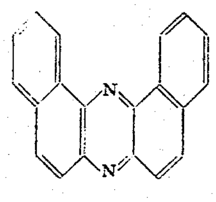

Formula 11

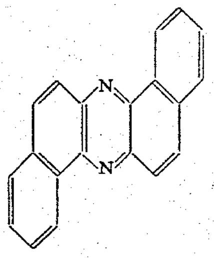

Formula 12

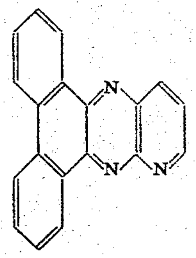

The heterocyclic basic structure of the acridine or phenazine type, which consists of three linearly annelated aromatic rings, may contain up to three substituents and up to two further annellated benzene rings. Suitable substituents are, e.g., halogen atoms, such as fluorine, chlorine, bromine or iodine; primary, secondary, and tertiary amino groups; acylated amino groups; alkyl groups having from one to about five carbon atoms; alkoxy groups having from one to about five carbon atoms; aryl groups having from six to about 10 carbon atoms; aryloxy groups having from six to about 10 carbon atoms; and aralkyl or aralkenyl groups with seven to about 12 carbon atoms.

Preferably, the halogen atoms are chlorine or bromine atoms; the alkyl groups are methyl, ethyl or isopropyl groups; the alkoxy groups are methoxy or ethoxy groups; the aryl groups are either unsubstituted phenyl groups or phenyl groups substituted by hydroxy, alkoxy or alkyl groups; the aryloxy groups are either unsubstituted phenoxy groups, or phenoxy groups substituted by hydroxy, alkoxy or alkyl groups; and the aralkyl and aralkenyl groups are benzyl or styryl groups. The secondary and tertiary amino groups may be substituted by lower alkyl groups with one to four carbon atoms, or by aryl groups, preferably phenyl groups. The acyl groups of the acylamino groups may be derived from aliphatic or aromatic carboxylic or sulfonic acids; groups of lower aliphatic and aromatic carboxylic acids, such as acetyl, propionyl and benzoyl groups, are preferred.

The copying compositions according to the invention contain, as essential components, binders, liquid and/or solid polymerizable organic compounds, and photoinitiators of the type herein described. Normally, the initiators are used in a concentration of 0.01 to 10 percent, based on the weight of the monomer used.

Suitable monomers are, for example, commercial acrylic acid and methacrylic acid esters, also diglycerol-diacrylate, guaiacol-glycerol-ether diacrylate, neopentyl-glycol-diacrylate, 2,2-dimethylolbutanol-(3)-diacrylate, and acrylates or methacrylates of hydroxyl group-containing polyesters of the type of DESMOPHEN (a product of Farbenfabriken Bayer, Leverkusen, Germany). These and other monomers which are suitable for use in the photopolymer layers according to the invention are described, for example, in U.S. Pat. Nos. 2,760,863 and 3,060,023.

The photopolymerizable copying compositions may contain one or more binders, as usual, such as solvent-soluble polyamides, polyvinyl acetates, polymethylmethacrylates, polyvinyl butyrals, unsaturated polyesters, alkali-soluble or alkali-swellable or -softenable styrene/maleic acid anhydride copolyers, maleic resins, terpene-phenol resins and the like. Since aqueous-alkaline developers are frequently used for development, binders which are either alkali-soluble or which soften in aqueous alkalies are preferred. Examples of such binders are copolymers of styrene and maleic anhydride, or of methyl methacrylate and methacrylic acid, and maleic resins.

Further, dyestuffs, pigments, polymerization inhibitors, color precursors, and hydrogen donors may be added to the copying compositions of the invention. Advantageously, such additives should not absorb excessive amounts of the actinic light required for the initiating process. Suitable hydrogen donors are, for example, known substances containing aliphatic ether bonds. In some cases, their function may be assumed by the binder or by the polymerizable substance, so that additional hydogen donors may be omitted.

The copying compositions of the invention are preferably used for the preparation of relief printing forms, relief images, offset printing forms, bimetal or trimetal printing forms, printed circuits, screen printing stencils, and printing forms for screenless offset printing.

If the copying composition is to be stored in liquid form, as a so-called photo resist composition, and only applied immediately before use to the desired support, for example a screen for screen printing or a conductive plate for making a printed circuit, the components of the layer are dissolved or dispersed in a suitable solvent or solvent mixture. Suitable solvents are alcohols, ketones, esters, ethers, amides, hydrocarbons, and the like. Most advantageously, the partial ethers of multivalent alcohols, especially the glycols, are used.

For the preparation of printing plates or the like, the solutions or dispersions may be applied immediately after their preparation to suitable supports, and the coated supports may be stored and sold as light-sensitive reproduction materials. For this purpose, the same or similar solvents may be used as are used for the preparation of the copying lacquers. The coatings may be applied by casting, by spraying, by immersion, and the like.

Suitable supports are, for example, zinc, copper, aluminum or steel foils, and also polyesters and acetate films and Perlon gauze. The surfaces of the supports may be subjected to a pretreatment, if desired.

If necessary, an adhesion-improving layer or an anti-halo layer may be applied between the support and the light-sensitive layer.

If relatively thick photopolymer layers, i.e. layers of a thickness of several tenths of a millimeter, are to be prepared, the copying composition according to the invention may be kneaded, for example in a triple roll mill, without first dissolving it in a solvent, and then pressed upon the support by hydraulic means, applying, for example, a pressure of 30,000 to 50,000 kg for 1 minute at a temperature of 90° C.

The printing forms, etch resists, screen printing forms and the like are prepared from suitable materials by the methods customary in the art, i.e. after exposure under a negative original; the still soluble non-image areas of the layer are removed by treatment with suitable solvents or with aqueous alkaline solutions.

The following Table 1 contains a number of compounds which are exemplary for the initiators to be used according to the invention. The structural formulae are given in the above table of formulae.

TABLE 1

| Compound No. | Formula No. | RRI No. | Substituents | | |
|---|---|---|---|---|---|
| 1 *a* | 1 | 3523 | $R_1$ = methyl | | |
| 1 *b* | | | chlorine | | |
| 1 *c* | | | styryl | | |
| 1 *d* | | | amino | | |
| 1 *e* | | | acetylamino | | |
| 1 *f* | | | phenoxy | | |
| 1 *g* | | | p-methoxy-phenoxy | | |
| 1 *h* | | | phenyl | | |
| 1 *i* | | | p-tolyl | | |
| 1 *k* | | | p-methoxyphenyl | | |
| 1 *l* | | | p-hydroxyphenyl | | |
| 2 *a* | 2 | 5144 | $R_2$ = H | | |
| 2 *b* | | | methyl | | |
| 3 | 3 | 5148 | — | | |
| 4 | 4 | 6296 | — | | |
| 5 | 5 | 6298 | — | | |
| 6 | 6 | 6295 | — | | |
| 7 | 7 | 3390 | — | | |
| 8 | 8 | 5007 | $R_3$ | $R_4$ | $R_5$ |
| 8 *a* | | | H | H | H |
| 8 *b* | | | methyl | methyl | H |
| 8 *c* | | | (H | methyl) | H + |
| | | | (methyl | H) | |
| 8 *d* | | | H | H | $CH_3$ |
| 8 *e* | | | (H | methoxy) | H + |
| | | | (methoxy | H) | |
| 9 *a* | 9 | 6621 | $R_6$ = H | | |
| 9 *b* | | | $R_6$ = methoxy | | |
| 10 | 10 | 6222 | — | | |
| 11 | 11 | 6223 | — | | |
| 12 | 12 | 6204 | — | | |

+ a mixture of the two isomers; see "The Chemistry of Heterocyclic Compounds", Volume Phenazines, pages 230 and 634.

A particularly good light-sensitivity is achieved when using the following compounds:

| | |
|---|---|
| 9-phenyl-acridine | (No. 1*h*) |
| 9-p-tolyl-acridine | (No. 1*i*) |
| 9-p-methoxyphenyl-acridine | (No. 1*k*) |
| 9-p-hydroxyphenyl-acridine | (No. 1*l*) |
| 9-acetylamino-acridine | (No. 1*e*) |
| benz(a)-acridine | (No. 2*a*) |
| 10-methyl-benz(a)-acridine | (No. 2*b*) |
| benz(a)-phenazine | (No. 8*a*) |
| 9,10-dimethyl-benz(a)-phenazine | (No. 8*b*) |
| 9-methyl-benz(a)-phenazine/ 0910-methyl-benz(a)-phenazine | (No. 8*c*) |
| 9-methoxy-benz(a)-phenazine/ 10-methoxy-benz(a)-phenazine | (No. 8*e*) |
| dibenz(a,c)-phenazine | (No. 9*a*) |
| 11-methoxy-dibenz(a,c)-phenazine | (No. 9*b*) |
| dibenz(a,j)-phenazine | (No. 10) |
| dibenz(f,h)-pyrido(2,3-b)quinoxaline | (No. 12) |

The invention will be further illustrated by the following examples, but is not limited thereto. The relation between parts by weight and parts by volume corresponds to that between grams and milliliters.

Example 1

The initiating activity of the photoinitiators, as a function of the composition of the copying layer, was investigated. The coating compositions stated in the following Table 2 were used.

TABLE 2

| Components | Recipe | | | |
|---|---|---|---|---|
| | R-I | R-II | R-III | R-IV |
| Lytron 822 1) | 1.4 g | | | |
| Alresat 618 c 2) | | 1.4 g | | |
| Copolymer A 3) | | | | 1.4 g |
| Copolymer B 4) | | | 1.4 g | |
| TMETA 5) | | | 1.4 g | |

| | | | | |
|---|---|---|---|---|
| TMPTA 6) | 1.3 g | 0.8 g | | 2.0 g |
| 1,6-dihydroxy-ethoxy-hexane | 0.2 g | | 0.2 g | 0.4 g |
| Initiator | 0.05 g | 0.05 g | 0.05 g | 0.05 g |
| Ethyleneglycol-monomethylether | | | | 23.0 g |
| Ethyleneglycol-monoethylether | 17.0 g | | 13.0 g | |
| Methylethylketone | | 9.5 g | | |

Explanation of the trade names and abbreviations used above (1–6):

1. Lytron 822: A styrene/maleic anhydride copolymer having a mean molecular weight of 10,000, an acid number of 190, and a softening temperature of about 190° C. — a commercial product of Monsanto Chemical Co., St. Louis, Mo., USA.
2. Alresat 618 C: A maleic resin having an acid number of approximately 165 and a melting interval of 120° – 130° C. — a commercial product of Reichhold-Albert Chemie AG., Wiesbaden-Biebrich, Germany.
3. Copolymer A: A polymer of 60 parts by weight of methylmethacrylate and 40 parts by weight of N-(p-tolylsulfonyl)-carbamic acid-(β-acryloyloxy)- ethylester, having an acid number of 60; see copending application Ser. No. 149,391 filed June 2, 1971, now U.S. Pat. No. 3,725,356.
4. Copolymer B: A polymer of methylmethacrylate and methacrylic acid, having a mean molecular weight of 40,000 and an acid number of 90 – 115.
5. TMETA: 1,1,1-Trimethylol-ethane-triacrylate, prepared by esterifying trimethylol ethane with acrylic acid.
6. TMPTA: 1,1,1-Trimethylol-propane-triacrylate, a commercial product of Sartomer Resins Inc., Essington, Pa., USA.

For stabilization, TMETA and TMPTA contain 0.02 to 0.2 percent of an inhibitor, e.g. hydroquinone.

The coating solutions are prepared by dissolving the components in the solvents stated and are then filtered in order to free them from any gelatinous components which may be present. By whirl-coating, the solutions are then applied to electrolytically roughened and anodized aluminum of 0.3 mm thickness the oxide layer of which has a weight of 3 g per square meter, and the resulting plates are then dried for 2 minutes in a drying closet at a temperature of 100° C. The dried layer has a weight of 5 grams per square meter.

The layers are exposed for 1 minute to the light of a 5 kW xenon point lamp (type COP XP 5,000, manufacturer: Staub, Neu-Isenburg, Germany), at a distance of 80 cm between lamp and vacuum printing frame, using a 21-step continuous tone gray wedge of Kodak which has a density range of 0.05 – 3.05 and density increments of 0.15. In this manner, the relative light-sensitivity of the layers is determined.

For removal of the non-image areas, the plates are wiped for 30 to 60 seconds with a developer solution consisting of 15 parts by weight of sodium metasilicate-nonahydrate, 3 parts by weight of polyglycol 6,000, 0.6 part by weight of levulinic acid, and 0.3 part by weight of strontium hydroxide-octahydrate in 1,000 parts by weight of water (pH value: 11.3), then rinsed with water, fixed with 1 percent phosphoric acid, and finally inked with black greasy ink.

When the reproduction layers are processed in this manner, the fully blackened steps of the Kodak wedge may serve as a measure of the initiating activity of the compounds tested.

In the following Tables 3 to 12, the number of fully blackened wedge steps is stated, intermediate steps showing different shades of gray being disregarded. The light-sensitivities of two neighboring wedge steps differ by the factor $\sqrt{2}$. The step 0 of the wedge corresponds to an optical density of 0.05 (absorption of the base film).

In the following tests 1 to 52, the initiating activity is measured, using the coating compositions R-I to R-IV in combination with an oxygen-impermeable protective layer. For this purpose, the copying layers prepared as described above are coated with a polyvinyl alcohol layer (thickness of the layer: 1–2μ).

TABLE 3

Coating Composition R-I

| Test No. | Compound No. | Number of Steps |
|---|---|---|
| 1 | 8 *b* | 11 |
| 2 | 8 *c* | 10 |
| 3 | 8 *e* | 10 |
| 4 | 12 | 9 |
| 5 | 8 *a* | 8 |
| 6 | 8 *d* | 8 |
| 7 | 9 *b* | 8 |
| 8 | 10 | 8 |
| 9 | 1 *h* | 8 |
| 10 | 1 *i* | 8 |
| 11 | 1 *b* | 7 |
| 12 | 1 *e* | 7 |
| 13 | 1 *l* | 7 |
| 14 | 2 *b* | 7 |
| 15 | 5 | 7 |
| 16 | 9 *a* | 7 |
| 17 | 1 *k* | 6 |
| 18 | 2 *a* | 6 |
| 19 | 4 | 5 |
| 20 | 11 | 5 |

For comparison: No image is produced under these conditions when using one of the known initiators N-phenyl-thioacridone, 1,3,5-triacetyl-benzene, 2-mercapto-benzthiazole, or 4,5-di-(p-anisyl)-2-phenyl-oxazole; step 0 is reproduced when using 2,4,6-tri-(p-anisyl)-thiopyrylium-perchlorate or 2,4-di-(p-anisyl)-6-phenyl-pyrylium-perchlorate; and four steps are reproduced when using 2-ethyl-anthraquinone.

TABLE 4

| Test No. | Compound No. | Number of steps, produced with R-II | with R-IV |
|---|---|---|---|
| 21 | 1 e | 3 | 5 |
| 22 | 1 k | 5 | 7 |
| 23 | 1 h | 5 | 7 |
| 24 | 1 i | 5 | 7 |
| 25 | 8 a | 4 | 6 |
| 26 | 8 c | 5 | 6 |
| 27 | 8 e | 5 | 7 |
| 28 | 9 a | 4 | 5 |

TABLE 5

Coating Composition R-III is used, 0.02 g of Supranol Blue Gl (C.I. 50335) being added in all cases for coloration of the layers.

| Test No. | Compound No. | Number of Steps |
|---|---|---|
| 29 | 1 *i* | 12 |
| 30 | 1 *h* | 11 |
| 31 | 8 *b* | 11 |
| 32 | 8 *e* | 11 |
| 33 | 1 *k* | 10 |
| 34 | 2 *b* | 10 |
| 35 | 8 *c* | 10 |
| 36 | 1 *f* | 9 |
| 37 | 1 *l* | 9 |
| 38 | 2 *a* | 9 |
| 39 | 8 *a* | 9 |
| 40 | 12 | 9 |
| 41 | 1 *b* | 8 |
| 42 | 4 | 8 |
| 43 | 1 *e* | 7 |
| 44 | 1 *c* | 6 |
| 45 | 1 *d* | 6 |
| 46 | 3 | 6 |
| 47 | 9 *b* | 6 |
| 48 | 1 *a* | 5 |
| 49 | 1 *g* | 5 |
| 50 | 6 | 5 |
| 51 | 5 | 4 |
| 52 | 8 *d* | 4 |

For comparison: The known initiator N-phenyl-thioacridone reproduces one step of the wedge, benzoin-methylether reproduces two steps, and Michler's ketone or 9,10-phenanthrenequinone reproduce three steps of the step wedge. Pyrylium salts and thiopyrylium salts proved to be inactive.

The following tests serve to measure the initiating activity in the presence of oxygen, the above described protective layer of polyvinyl alcohol being omitted.

TABLE 6

Coating Composition R-I:

| Test No.: | Initiator | Number of Steps |
|---|---|---|
| 53 | 8 *a* | 5 |
| 54 | 12 | 4 |
| 55 | 8 *b* | 3 |
| 56 | 8 *c* | 3 |
| 57 | 8 *e* | 3 |
| 58 | 1 *i* | 3 |
| 59 | 1 *e* | 3 |
| 60 | 1 *h* | 2 |
| 61 | 1 *k* | 1 |
| 62 | 2 *a* | 1 |
| 63 | 2 *b* | 1 |
| 64 | 9 *a* | 1 |
| 65 | 8 *d* | 0 |
| 66 | 9 *b* | 0 |
| 67 | 1 *b* | 0 |
| 68 | 1 *l* | 0 |
| 69 | 5 | 0 |

The known initiators mentioned above produce no image under the described conditions.

TABLE 7

Coating composition R-III is used, 0.02 g of Supranol Blue Gl being added in all cases for coloration of the layer.

| Test No. | Initiator | Number of Steps |
|---|---|---|
| 70 | 1 *h* | 7 |
| 71 | 1 *i* | 4 |
| 72 | 1 *k* | 4 |
| 73 | 1 *l* | 4 |
| 74 | 2 *a* | 4 |
| 75 | 2 *b* | 4 |
| 76 | 1 *e* | 3 |
| 77 | 4 | 3 |
| 78 | 1 *b* | 2 |
| 79 | 1 *c* | 2 |
| 80 | 1 *f* | 2 |
| 81 | 8 *c* | 2 |
| 82 | 1 *a* | 1 |
| 83 | 8 *a* | 1 |
| 84 | 8 *b* | 1 |
| 85 | 8 *e* | 1 |
| 86 | 5 | 0 |
| 87 | 7 | 0 |
| 88 | 12 | 0 |

The above-mentioned known initiators produce no image under the conditions stated.

The reproduction materials described under the test numbers 70 and 74 are exposed for 1 minute under a negative original in a vacuum printing frame, using the above described light source, then wiped for 1 minute with the developer described above in order to remove the non-image areas, rinsed with water, fixed by means of 1 percent phosphoric acid, and finally gummed with an aqueous solution of gum arabic for preservation.

At least 100,000 flawless offset prints were run from the printing forms thus produced on a Dualith printing machine (manufacturer: Graph. Bedarf und Maschinenbau GmbH., Frankenthal/Pfalz, Germany).

Example 2

A coating solution is prepared from 1.0 part by weight of a polyester (DESMOPHEN 850, a product of Farbenfabriken Bayer, Leverkusen, Germany) in which the free OH groups are esterified with methacrylic acid,
0.4 part by weight of diglycerol-diacrylate,
1.4 parts by weight of Copolymer B (see Ex. 1),
0.1 part by weight of initiator,
0.2 part by weight of 1,6-dihydroxy-ethoxy-hexane,
0.02 part by weight of Supranol Blue Gl (C.I. 50335), and
15.0 parts by weight of ethyleneglycol monoethyl ether and applied, by whirl-coating, to an electrolytically roughened, 0.1 mm thick aluminum sheet (ROTABLATT, a product of Rotaprint A. G., Berlin, Germany) in such a manner that the layer has an approximate weight of 5 g per square meter. The layer is then dried for 2 minutes in a drying closet at 100° C. Processing is as described in Example 1, the following results being obtained.

TABLE 8

| Test No. | Initiator No. | Number of Steps |
|---|---|---|
| 89 | 1 *h* | 7 |
| 90 | 8 *c* | 6 |
| 91 | 8 *e* | 6 |
| 92 | 12 | 5 |
| 93 | 8 *a* | 3 |

For comparison: No image is produced under these conditions when using benzoin-methylether or N-phenyl-thioacridone, and only a "ghost image" is discernible in the case of phenanthrene quinone and Michler's ketone.

Example 3

A coating solution is prepared from 1.4 parts by weight of Lytron 822 (see Ex. 1),
1.3 parts by weight of the modified polyester used in Example 2,
0.2 part by weight of 1,6-dihydroxy-ethoxy-hexane,
0.1 part by weight of benz-(a)-phenazine (No. 8*a*),
0.02 part by weight of Sudan Blue II (C.I. Solvent Blue 35), and
17.0 parts by weight of ethyleneglycol monoethyl ether, and whirl-coated as described in Example 2 upon an electrolytically roughened 0.1 mm thick aluminum sheet. Exposure, development, and evaluation are as described in Example 1; four steps of the step wedge are reproduced.

Example 4

A coating solution is prepared from 1.4 parts by weight of the modified polyester used in Example 2, but esterified with acrylic acid,
1.4 parts by weight of a methylmethacrylate/methacrylic acid copolymer with a mean molecular weight of 60,000 and an acid number of 93.7,
0.1 part by weight of 9-phenyl-acridine (No. 1*h*),
0.2 part by weight of 1,6-dihydroxy-ethoxy-hexane,
0.02 part by weight of Supranol Blue Gl (C.I. 50335), and
13.0 parts by weight of ethyleneglycol monoethyl ether, and whirl-coated, as described in Example 1, onto electrolytically roughened and anodized sheet aluminum of 0.3 mm thickness and then dried.

Exposure, development, and evaluation are as described in Example 1. The number of fully blackened steps of the step wedge is five.

If the above described acrylic acid ester is replaced by the corresponding methacrylic acid-modified polyester, the number of steps is increased to seven.

If, instead of the corresponding polymerizable compound, 1.4 parts by weight of another hydroxyl group-containing polyester esterified by methacrylic acid is used (DESMOPHEN TO, a product of Farbenfabriken Bayer, Leverkusen, Germany), the number of steps which are reproduced is three.

When using one of the known initiators N-phenyl-thioacridone, benzoin-methyl-ether, 2-mercapto-benzthiazol, Michler's ketone/xanthone (1:1), 2-tert.-butyl-anthraquinone, 4,5-di-(p-anisyl)-2-phenyl-oxazole or 2,4,6-tri-(p-anisyl)-thiopyrylium perchlorate, it is impossible to produce reproduction layers of comparable light-sensitivity with the above described compositions.

EXAMPLE 5

A coating solution corresponding to the coating composition R-I used in Example 1, but containing 0.1 g of initiator, is whirl-coated onto a 125 $\mu$ thick biaxially stretched polyester film provided with an adhesion-improving layer as described in German published patent application (DAS) No. 1,228,414, and then dried.

The coated film is then exposed for 1 minute, at a distance of 75 cm, under a step wedge, using an 8 kW xenon point lamp (type BIKOP, manufacturer: Klimsch, Frankfurt/M., Germany), and developed as described in Example 1.

The following table shows the initiating activities of the different initiators used:

TABLE 9

| Test No. | Initiator No. | Number of Steps |
|---|---|---|
| 94 | 8 *c* | 7 |
| 95 | 8 *a* | 5 |
| 96 | 8 *b* | 5 |
| 97 | 8 *e* | 5 |
| 98 | 1 *h* | 5 |
| 99 | 1 *i* | 5 |
| 100 | 1 *e* | 4 |
| 101 | 12 | 3 |
| 102 | 2 *a* | 3 |
| 103 | 3 | 2 |
| 104 | 4 | 1 |
| 105 | 2-ethyl-anthraquinone | 0 |

The above described reproduction material may be used for the production of individual copies.

Example 6

A coating solution is prepared from 1.4 parts by weight of a terpene-phenol resin (ALRESEN 500 R, a product of Reichhold-Albert Chemie AG., Wiesbaden-Biebrich, Germany), having an acid number of 60 – 70 and a softening range of 117°–130° C., 1.0 part by weight of trimethylol-ethane-triacrylate, 0.02 part by weight of Sudan Blue II, 0.05 part by weight of initiator, and 8.0 parts by weight of methyl ethyl ketone, applied to a cleaned quick-etching zinc plate by whirl-coating, and dried.

The plate is exposed for 1 minute under a step wedge, using the light source mentioned in Example 5, and then developed as described in Example .1.

The different initiators used resulted in the following relative light-sensitivities:

TABLE 10

| Test No. | Initiator No. | Number of Steps |
|---|---|---|
| 106 | 1 *a* | 7 |
| 107 | 1 *i* | 7 |
| 108 | 1 *h* | 6 |
| 109 | 2-ethyl-anthraquinone | 4 |

The following table shows the relative light-sensitivities achieved when using the coating composition R-III described in Example 1:

TABLE 11

| Test No. | Initiator No. | Number of Steps |
|---|---|---|
| 110 | 1 *h* | 8 |
| 111 | 1 *i* | 7 |
| 112 | 1 *k* | 7 |
| 113 | 2 *a* | 7 |
| 114 | 1 *e* | 4 |

For the preparation of relief printing forms, the bared zinc areas are etched for 5 minutes at room temperature, using a 6 percent nitric acid solution.

In a parallel test, the reproduction material obtained by Test No. 113 is provided with a polyvinyl alcohol coating of $1-2\mu$ thickness, exposed for about 105 seconds under a negative original as described in Example 1, developed as described in Example 1, and finally etched for 30 minutes at a temperature of 27° C. in a quick-etching machine, using a 6 percent solution of nitric acid to which an additive for powderless etching has been added.

The printing form thus produced is suitable for high-quality book printing.

Example 7

After removal of the preserving layer, the copper surface of a bimetal plate consisting of copper and aluminum layers is roughened by rubbing it with whiting, degreased with trichloroethylene, freed from its oxide layer by immersing it for 30 seconds in a 1.5 percent solution of nitric acid, and then pretreated for 1 minute with a solution of 84 ml of distilled water and 8 ml of a chromate solution (KENVERT No. 31, a product of Conversion Chemical Corporation, Rockville, Conn., USA).

On a plate whirler, the coating compositions R-I and R-III prepared as described in Example 1 are applied to the thus pretreated surfaces and then dried. Exposure is as in Example 5, and development and evaluation correspond to those mentioned in Example 1.

The following table shows the light-sensitivities achieved, once in the presence of oxygen, and once when using an oxygen-impermeable overcoat as described in Example 6:

TABLE 12

| Test No. | Initiator | Composition R-I with precoat | Composition R-I without precoat | Composition R-III with precoat | Composition R-III without precoat |
|---|---|---|---|---|---|
| 115 | 8 *a* | 9 | 5 | | |
| 116 | 8 *c* | | 6 | 11 | 5 |
| 117 8 *e* | | 11 | 6 | | |
| 118 8 *b* | | 10 | 5 | | |
| 119 | 12 | 6 | 2 | | |
| 120 | 1 *i* | 9 | 5 | 14 | 9 |
| 121 | 1 *g* | | | 13 | 5 |
| 122 | 1 *h* | | | 13 | 6 |
| 123 | 2 *b* | | | 12 | 4 |
| 124 | 2 *a* | | | 11 | 9 |
| 125 | Michler's ketone | 6 | 0 | — | — |
| 126 | 2-ethyl-anthraquinone | 3 | 1 | 9 | 0 |
| 127 | 2-mercapto-benz-thiazole | | no image | | |

For the preparation of a bimetal plate suitable for offset printing, the bared copper areas are deep-etched after development by treating the plate for 2½ to 3 minutes with a commercial iron-III-chloride etching solution ("400 Series", ALC Etch, Type LS 402, a product of Fred K. H. Levey Co., Inc., New York, USA) and then wiped over with a 1 percent phosphoric acid solution and inked with greasy printing ink.

Example 8

A coating solution is prepared from 1.4 parts by weight of the modified polyester described in Example 2,
1.4 parts by weight of Copolymer B (see Ex. 1),
0.05 part by weight of 9-phenyl-acridine (No. 1*h*),
0.2 part by weight of 1,6-dihydroxy-ethoxy-hexane,
0.02 part by weight of Supranol Blue Gl, and
8.0 parts by weight of methyl ethyl ketone, applied to a mono-filament Perlon fabric having 120 threads per cm, and then dried. The material is exposed for 3 minutes under a positive original as described in Example 1 and developed for 5 minutes as described in the same example. The stencil thus produced may be used for screen printing. It is distinguished by a very high resistance to abrasion and excellent sharpness of the contours.

Instead of the fabric of artificial filaments, silk, metal fabrics, glass fibers and the like may be used.

Example 9

For the production of color proofing foils, four solutions are prepared corresponding to the coating composition R-I of Example 1, using 0.05 g of benz(a)-phenazine (No. 8*a*) as initiator, and these four coating solutions are then mixed, respectively, with the following four dyestuffs:

a. Yellow Foil: 0.04 of Fatty Yellow 3 G (C.I. 12,700)
b. Red Foil: 0.02 g of Zapon Fast Red BE (C.I. 12,715) and
0.02 g of Zapon Fast Red BB (C.I. Solvent Red 71)
c. Blue Foil: 0.02 g of Zapon Fast Blue HFL (C.I. 74,350)
d. Black Foil: 0.04 g of Fatty Black HB (C.I. 26,150).

Each of the four solutions is coated upon a 180$\mu$ thick, biaxially stretched polyester film and dried for 2 minutes at 100°C. The layers are then provided with a 1–2$\mu$ thick polyvinyl alcohol coating and exposed, as described in Example 1, under the corresponding color separation silver films (blue foil for 1 minute, red foil for 2 minutes, yellow and black foil each for 5 minutes). Development is performed as described in Example 1.

When the color proofing foils are superimposed, an image corresponding to the original used is obtained, which faithfully reproduces its colors.

Example 10

A coating solution is prepared from 2.9 parts by weight of trimethylol-ethane-triacrylate,
4.9 parts by weight of a methyl-methacrylate/methacrylic acid copolymer having a mean molecular weight of 40,000 and an acid number of 125,
0.3 part by weight of 9-phenyl-acridine (No. 1*h*), and
10.0 parts by weight of methyl ethyl ketone, and cast upon an aluminum sheet of 0.3 mm thickness, whose edges have been bent up at an angle of 90°. Thereafter, the plate is allowed to stand until the solvent has slowly evaporated. Then it is further dried for 1 hour at 100°C. The 0.6 mm thick photopolymer layer thus produced is then exposed for 20 minutes under a photographic negative, using a three-phase carbon arc lamp (type 60 A "Brillant", manufacturer: Staub, New-Isenburg, Germany) at a distance of 110 cm, and finally developed by treating it for 15 minutes, in a rocking bath, with the developer solution described in Example 1.

A firmly adhering, light-yellow colored relief image is thus produced which may be used for relief printing or letterset printing after removal of the bent edges.

Example 11

A coating solution corresponding to the coating composition R-III described in Example 1 is produced, using 0.05 g of benz(a)-acridine (No. 2*a*) as initiator, and the solution is whirl-coated onto a support consisting of layers of brass and chromium and then dried. The reproduction layer is then coated with a protective polyvinyl alcohol layer of 1–2$\mu$ thickness, exposed for 1 minute under a positive original as described in Example 1, and developed as described in the same example. The bared chromium areas are then deep-etched by 5 minutes' treatment with a solution containing 17.4% of $CaCl_2$, 35.3% of $ZnCl_2$, 2.1% of HCl, and 45.2 percent of water, and the hardened photopolymer layer is removed by wiping with methylene chloride. The plate is then wiped over with 1 percent phosphoric acid and inked up with greasy printing ink. The plate is now ready for printing.

Example 12

A coating solution corresponding to coating composition R-III is prepared, using 0.05 g of 9-phenyl-acridine (No. 1*h*) as initiator, and is whirl-coated onto an aluminum support covered with a hydrophilic chromium layer and dried. The reproduction layer is then provided with a protective layer of polyvinyl alcohol (1–2$\mu$).

The plate is exposed (3 minutes), developed, and fixed as described in Example 1.

When used for offset printing, the printing plate thus produced yields at least 100,000 flawless prints in a commercial printing machine.

It will be obvious to those skilled in the art that many modifications may be made within the scope of the present invention without departing from the spirit thereof, and the invention includes all such modifications.

What is claimed is:

1. A photopolymerizable copying composition comprising at least one binder, at least one polymerizable acrylic acid or methacrylic acid ester and at least one photoinitiator having one of the formulae:

I

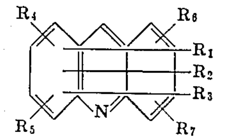

and

II

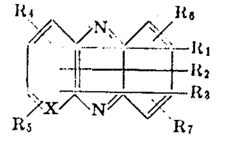

in which $R_1$, $R_2$, and $R_3$ are selected from the group consisting of hydrogen, halogen, alkyl, alkoxy, aryl, aryloxy, amino, acylamino, and aralkenyl groups, $R_4$, $R_5$, $R_6$, and $R_7$ are H or annelated benzene rings, with no more than two annelated benzene rings being present per molecule, however, and X is selected from the group consisting of N and $\overset{H}{\overset{|}{C}}$.

2. A copying composition according to claim 1 in which the photoinitiator is selected from the group consisting of 9-phenyl-acridine,
9-p-tolyl-acridine,
9-p-methoxyphenyl-acridine,
9-p-hydroxyphenyl-acridine,
9-acetylamino-acridine,
benz(a)-acridine,
10-methyl-benz(a)-acridine,
benz(a)-phenazine,
9,10-dimethyl-benz(a)-phenazine,
dibenz(a,c)-phenazine,
11-methoxy-dibenz(a,c)-phenazine,
dibenz(a,j)-phenazine, and
dibenz(f,h)-pyrido-(2,3-b)-quinoxaline.

3. A copying composition according to claim 1 in which the binder is alkali-soluble or alkali-softenable.

4. A copying composition according to claim 1 containing, in addition, at least one hydrogen donor.

5. A copying composition according to claim 1 in the form of a light-sensitive layer on a support.

* * * * *